(12) United States Patent
Boswinkel

(10) Patent No.: US 11,817,787 B2
(45) Date of Patent: Nov. 14, 2023

(54) SWITCH MODE POWER SUPPLY (SMPS) CIRCUIT

(71) Applicant: NXP B.V., Eindhoven (NL)

(72) Inventor: Hendrik Jan Boswinkel, Nijmegen (NL)

(73) Assignee: NXP B.V., Eindhoven (NL)

( * ) Notice: Subject to any disclaimer, the term of this patent is extended or adjusted under 35 U.S.C. 154(b) by 129 days.

(21) Appl. No.: 17/161,094

(22) Filed: Jan. 28, 2021

(65) Prior Publication Data

US 2022/0239232 A1 Jul. 28, 2022

(51) Int. Cl.
*H02M 3/335* (2006.01)

(52) U.S. Cl.
CPC ... *H02M 3/33569* (2013.01); *H02M 3/33507* (2013.01)

(58) Field of Classification Search
CPC ........ H02M 3/33569; H02M 3/33507; H02M 1/0003; H02M 3/01; H02M 1/092; H03K 2217/0081; H03K 17/691; Y02B 70/10
See application file for complete search history.

(56) References Cited

U.S. PATENT DOCUMENTS

| | | | |
|---|---|---|---|
| 4,232,280 A * | 11/1980 | Forward | H03H 11/52 333/213 |
| 4,439,821 A * | 3/1984 | Grippe | H02M 3/3378 363/97 |
| 4,495,554 A | 1/1985 | Simi et al. | |
| 5,757,627 A | 5/1998 | Faulk | |
| 6,018,467 A * | 1/2000 | Majid | H02M 3/33571 363/16 |
| 6,154,375 A * | 11/2000 | Majid | H02M 3/3376 363/16 |
| 6,208,531 B1 * | 3/2001 | Vinciarelli | H02M 3/33553 363/21.07 |
| 8,564,977 B2 | 10/2013 | Halberstadt | |
| 8,699,239 B2 | 4/2014 | Halberstadt | |
| 10,250,126 B1 | 4/2019 | Chen et al. | |
| 10,868,473 B2 * | 12/2020 | Chang | H02M 1/08 |
| 10,951,107 B2 * | 3/2021 | Khamesra | H02M 1/08 |

(Continued)

FOREIGN PATENT DOCUMENTS

| | | | | |
|---|---|---|---|---|
| JP | 2006278044 | * | 10/2006 | ............. H05B 41/24 |
| WO | WO-2013/111290 A1 | | 8/2013 | |

OTHER PUBLICATIONS

Attached translated version of foreign patent JP2006278044. (Year: 2006).*

(Continued)

*Primary Examiner* — Emily P Pham
*Assistant Examiner* — Htet Z Kyaw

(57) ABSTRACT

One example discloses a switch mode power supply (SMPS) circuit configured to receive an input voltage and generate an output voltage, including: a set of switching devices configured to receive the input voltage; a first transformer, having an input winding coupled to the switching devices, and an output winding configured to generate the output voltage; a second transformer, having an input winding coupled to receive the output voltage from the first transformer, and an output winding configured to generate an output voltage monitoring signal; and a controller configured to control the switching devices based on the output voltage monitoring signal.

19 Claims, 4 Drawing Sheets

(56) References Cited

U.S. PATENT DOCUMENTS

2016/0190938 A1* 6/2016 Wang ............... H02M 3/33507
363/21.12
2020/0204079 A1* 6/2020 Guo ..................... H02M 3/285
2020/0280313 A1 9/2020 Rinne et al.

OTHER PUBLICATIONS

Hang, Li-jun et al; "Multi-output LLC Resonant Converters With Symmetrical Auxiliary Output Structures"; IEEE Explore; 5 pages (2006).
Infineon; "AN 201707 PL52 022: 800 W Platinum Server Power Supply—Chapter 5"; retreived from the internet https://www.infineon.com/dgdl/Infineon-ApplicationNote_EVAL_800W_PSU_4P_C7-AN-v01_00-EN.pdf?fileId=
5546d4625cc9456a015d36354c482b7a; 66 pages (Jul. 10, 2017).
Maxim: "Application Note 998—5V Step-Down Converter Has Transformer-Isolated Feedback"; 2 pages (Jul. 9, 1998).
NXP; "NXP TEA2016 and TEA1995 ICs—Fact Sheet, Rev 1"; retrieved from the Internet www.nxp.com/fact-sheet/TEA20161995FSDAS on Jan. 20, 2021; 2 pages.
NXP; TEA19161T/2—Digital Controller for High-Efficiency Resonant Power Supply—Rev. 2; 43 pages (Aug. 30, 2019).
NXP; "TEA2017AAT/2—Digital configurable LLC and multimode PFC controller—Rev. 1.1"; 62 pages (Feb. 24, 2022).

* cited by examiner

SWITCH MODE POWER SUPPLY (SMPS) CIRCUIT

The present specification relates to systems, methods, apparatuses, devices, articles of manufacture and instructions for power supplies.

SUMMARY

According to an example embodiment, a switch mode power supply (SMPS) circuit configured to receive an input voltage and generate an output voltage, comprising: a set of switching devices configured to receive the input voltage; a first transformer, having an input winding coupled to the switching devices, and an output winding configured to generate the output voltage; a second transformer, having an input winding coupled to receive the output voltage from the first transformer, and an output winding configured to generate an output voltage monitoring signal; and a controller configured to control the switching devices based on the output voltage monitoring signal.

In another example embodiment, the controller is configured to control the switching devices based only on the output voltage monitoring signal.

In another example embodiment, the output voltage monitoring signal is also configured as a power supply for the switch mode power supply.

In another example embodiment, the output voltage monitoring signal is also configured as a power supply for the controller.

In another example embodiment, the controller is solely powered by the output voltage monitoring signal.

In another example embodiment, the controller is solely powered by the output voltage monitoring signal after the switch mode power supply circuit reaches a stable operating state.

In another example embodiment, the input voltage is a rectified supply (Vbus) voltage.

In another example embodiment, the switching devices form a half-bridge.

In another example embodiment, the input winding of the second transformer is coupled directly to the output winding of the first transformer.

In another example embodiment, the output winding of the second transformer is coupled directly to the controller.

In another example embodiment, the first transformer is a resonant transformer and the second transformer is an auxiliary transformer.

In another example embodiment, the switch mode power supply (SMPS) is a resonant power converter.

In another example embodiment, in the second transformer, a ratio of a number of wire turns in the input winding to a number of wire turns in the output winding is a non-integer number.

In another example embodiment, the output winding of the second transformer is center tapped to enable full wave rectification.

In another example embodiment, a magnetic flux of the first transformer is isolated from a magnetic flux of the second transformer.

In another example embodiment, the output winding of the first transformer is configured to be coupled to a load drawing a load current; and the second transformer is configured to draw a current that is independent of the load current.

In another example embodiment, the switching devices are switching transistors.

In another example embodiment, the controller is also configured to receive the input voltage as a power supply for the controller.

In another example embodiment, further comprising an LC circuit coupling the switching devices and the first transformer's input winding.

According to another example embodiment, a resonant power converter configured to receive an input voltage and generate an output voltage, comprising: a set of switching devices configured to receive the input voltage; a first transformer, having an input winding coupled to the switching devices, and an output winding configured to generate the output voltage; a second transformer, having an input winding coupled to receive the output voltage, and an output winding configured to generate an output voltage monitoring signal; and a controller configured to control switching of the switching devices based on the output voltage monitoring signal.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
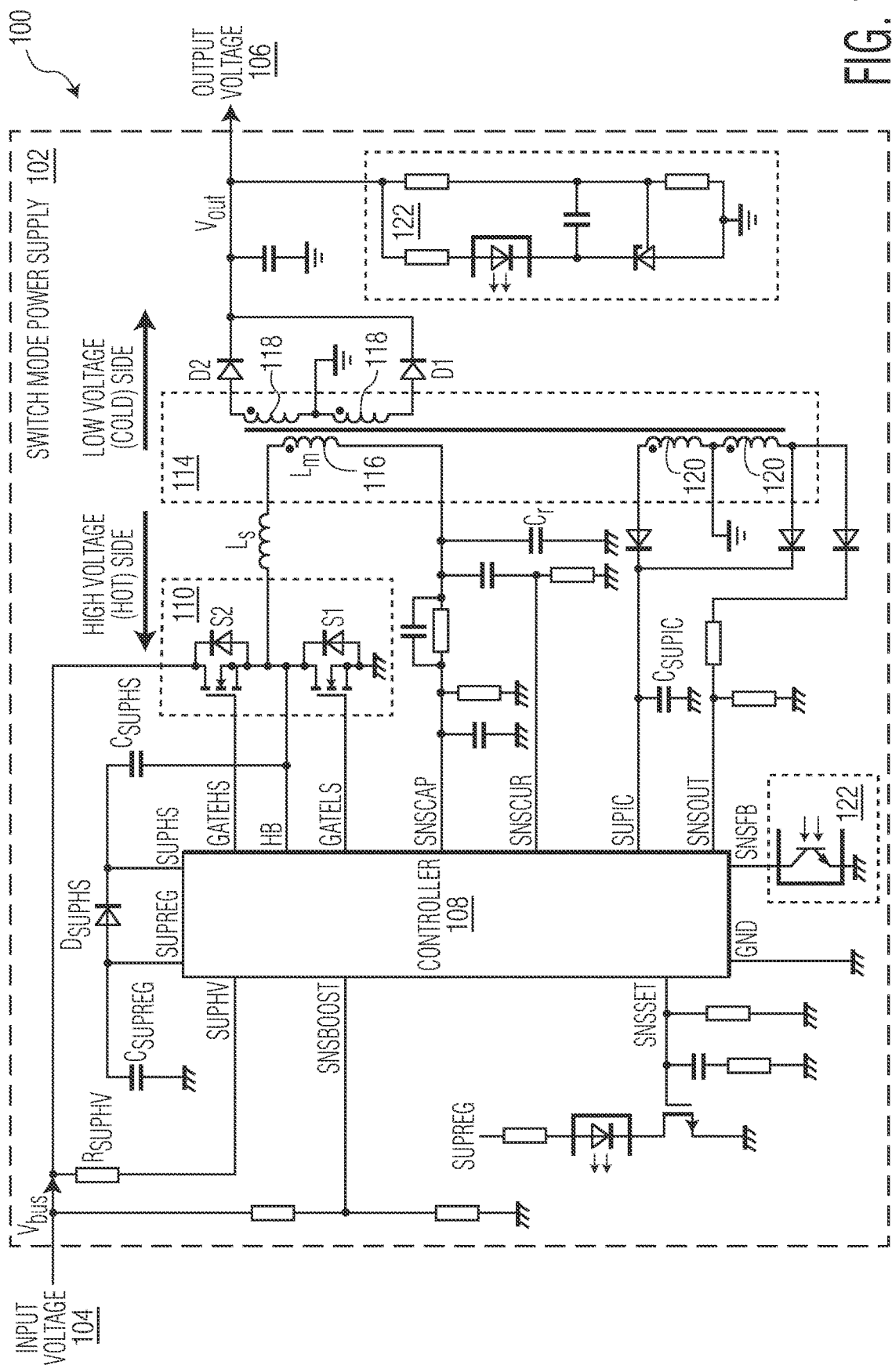
FIG. 1 represents an example switch mode power supply with a single transformer.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Switch mode power supplies are used in many power supply applications for many electronic devices. At start-up, such Switch mode power supplies may be bootstrapped by a rectified supply voltage, but then quickly switch to being powered by their own regulated output voltages sent to a set of downstream circuits to be supplied and protected.

Such switch mode power supplies are also configured to receive a sensing and/or monitoring signal that is intended to roughly parallel the switch mode power supplies' actual output voltage and which is used for supply of the controller and/or feedback for protection and/or regulation of the output voltage. For example, some switch mode power supplies use an auxiliary winding from a same transformer to generate the sensing signal.

FIG. 1 represents an example 100 switch mode power supply 102 with a single transformer. The example 100 includes the switch mode power supply 102 coupled to receive an input voltage (Vbus) 104 and generate an output voltage (Vout) 106. The switch mode power supply 102 includes a controller 108, switching devices 110, an LC circuit (formed by Ls, Lm, Cr as shown in FIG. 1) and a transformer 114. The transformer 114 includes input winding 116 on a primary/high-voltage/hot side, output winding 118 on a secondary/low-voltage/cold side, and an auxiliary winding 120. In some example embodiments (e.g. half bridge designs) the controller 108 can be split up into a controller and a level shifter.

In this example, the controller 108 chip is placed on the primary/high-voltage/hot side and connected to the input winding 116 and to the auxiliary winding 120. The controller 108 controls the switching devices 110 (e.g. switching transistors) that are coupled by the LC circuit to the transformer 114 to control the output voltage (Vout) 106. An optical control circuit 122 provides output voltage (Vout) 106 feedback to the controller 108 for controlling the switching devices 110. The controller 108 can also use the auxiliary winding 120 to indirectly sense/monitor the output voltage (Vout) 106.

In some example embodiments during startup the controller 108 chip is directly supplied from the input voltage (Vbus) 104 (i.e. high-voltage rectified voltage (Vbus)). After startup the controller 108 chip may be also supplied from auxiliary winding 120 on the transformer 114 as shown in FIG. 1. The secondary output winding 118 and the auxiliary winding 120 are center tapped to enable full wave rectification. A secondary winding output voltage from the output winding 118 is provided to a rectification circuit, represented by diodes D1, D2 but which in some applications (e.g. high power) can be any variety of synchronous rectification circuits.

Figure 2:
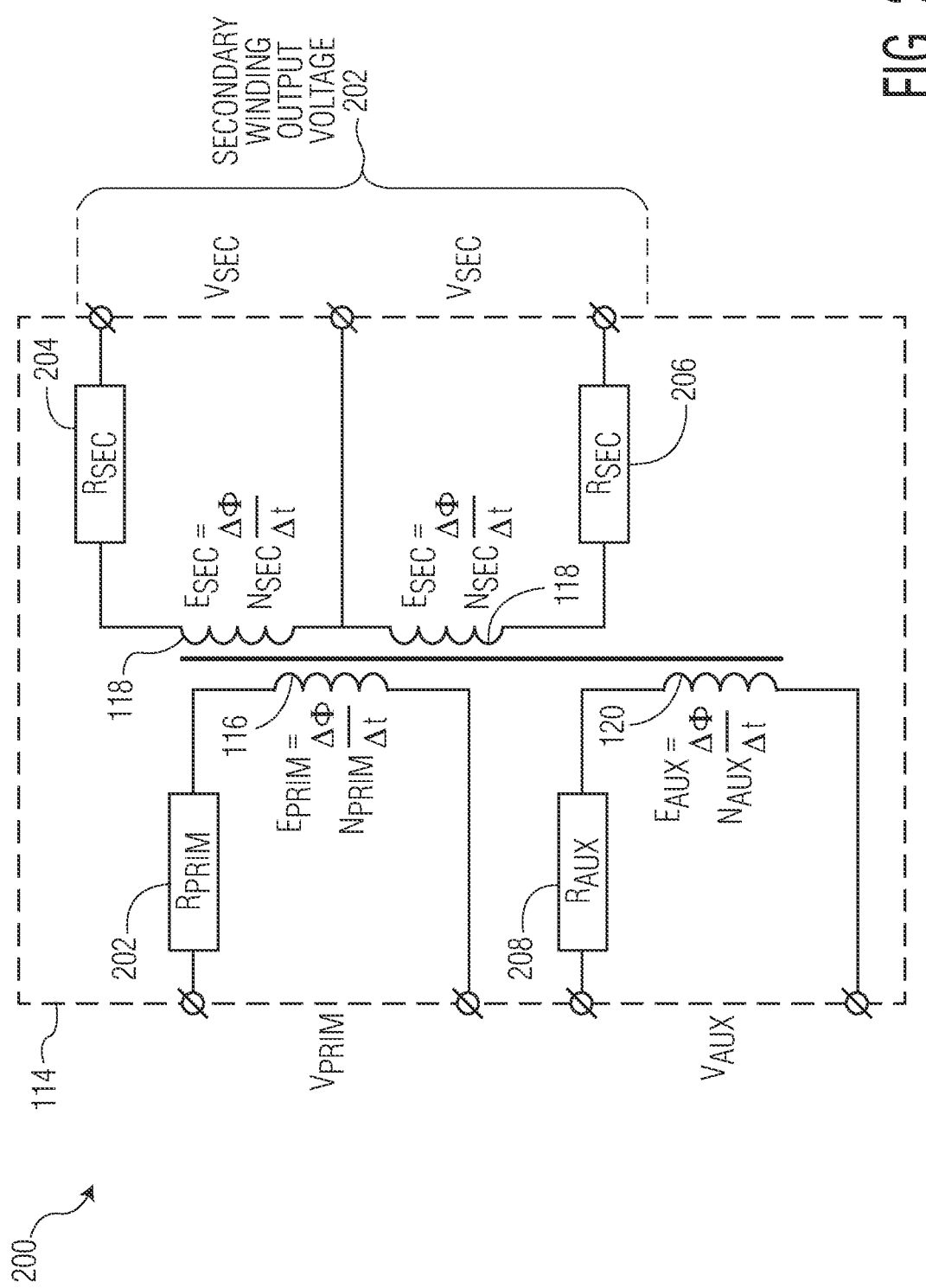
FIG. 2 represents an example of the single transformer in the switch mode power supply.

FIG. 2 represents an example 200 of the single transformer 114 in the switch mode power supply 102. The example 200 transformer 114 shows: the input winding 116 (e.g. primary winding) having Nprim turns and Rprim 202 total winding resistance; the output winding 118 (e.g. secondary winding) having Nsec turns and Rsec 204/206 total winding resistance on either side of the center-tap; and the auxiliary winding 120 having Naux turns and Raux 208 total winding resistance. A secondary winding output voltage (Vsec) 202 is shown as generated by the output winding 118.

In this configuration, the auxiliary voltage ($V_{aux}$) is in the first order determined by the turns ratio Naux/Nsec and the secondary winding output voltage (Vsec) 202. The $V_{aux}$ is not only used to supply the controller 108 chip (IC) but also for output overvoltage/undervoltage detection because the $V_{aux}$ ideally should reflect the value of the secondary winding output voltage (Vsec) 202. Vout is kept constant by using either the optical control circuit 122 coupled to the controller 108 (e.g. labeled SNSFB in FIG. 1) or by feeding Vaux into the controller 108 chip (e.g. labeled SNSOUT in FIG. 1) which then controls the switching devices 110 so that the secondary voltage (Vsec) will also be constant and at a selected regulated voltage value.

This switch mode power supply 102 works well for applications with a relatively low output current where the secondary voltage Vsec is only a little bit below an induced voltage ($E_{sec}=N_{sec}*d\Phi/dt$) in the transformer 114.

However, in applications with high output currents (e.g. >40 A), a voltage drop across the resistance Rsec becomes significant. Vsec is kept constant by the control loop, so at higher secondary currents, the value of the induced voltage ($E_{sec}$) and thus $\Delta\Phi/\Delta t$ the must be higher in order to compensate for the loss in Rsec. The auxiliary winding is experiencing the same $\Delta\Phi/\Delta t$, so $E_{aux}$ will also rise at higher secondary output currents, but the current in the auxiliary winding is low.

In some example embodiments, an end result of this circuit configuration is an auxiliary voltage ($V_{aux}$) that rises when the output current increases, and thus the auxiliary voltage would not reliably mimic the output voltage (Vout) 106 anymore and could not be used for output voltage (Vout) 106 overvoltage detection. In some example embodiments, the $V_{aux}$ rise at high secondary output currents can become so large that $V_{aux}$ exceeds a maximum supply voltage of the controller 108 chip and thus could damage the controller 108.

In some example applications, with high output currents, the output/secondary winding 118 consists of only one winding. Because then the turns ratio Naux/$N_{sec}$ is a whole number, the auxiliary voltage is a multiple of the output voltage (Vout) 106. For example, if the output voltage (Vout) 106 is 12V, then the auxiliary voltage would be 12V, 24V, 36V, and so on depending upon the number of whole turns. Since the controller 108 chip could have a limited supply voltage (e.g. labeled SUPIC (Supply IC) in FIG. 1) range, together with an auxiliary voltage rise at higher currents, the controller 108 could not use the auxiliary winding as a power supply for the controller 108 chip.

Such high-currents are becoming more and more prevalent in applications such as data center power supplies and fast charging personal electronic devices and when charging electric cars.

Now discussed is a more robust switch mode power supply circuit for both sensing/monitoring an output voltage provided to downstream circuits and for powering the switch mode power supply itself using a second transformer coupled to receive a secondary winding output voltage.

Figure 3:
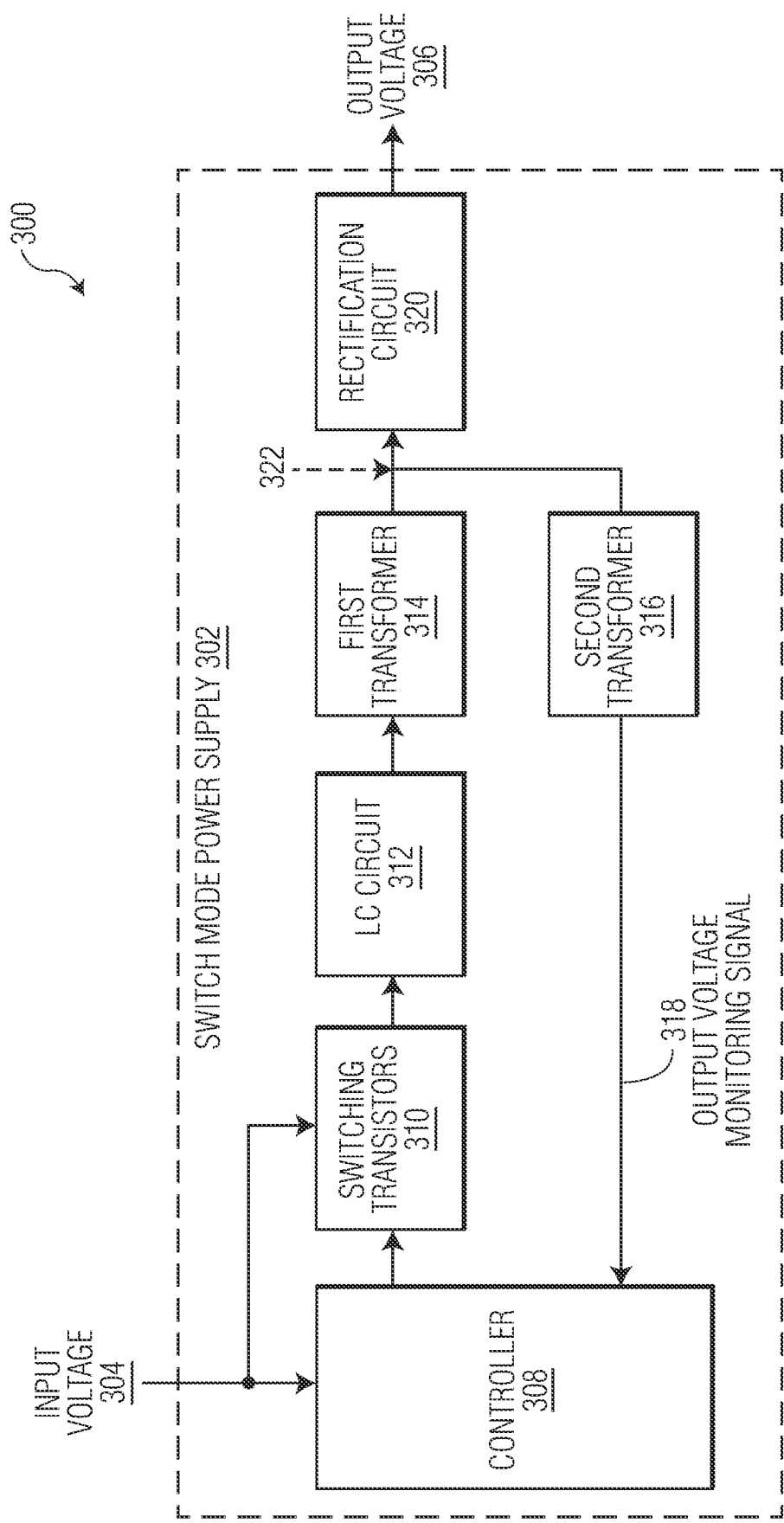
FIG. 3 represents a first example switch mode power supply with two transformers.

FIG. 3 represents a first example 300 switch mode power supply 302 with two transformers. The example 300 switch mode power supply 302 is coupled to receive an input voltage 304 and generate an output voltage 306. The switch mode power supply 302 includes a controller 308, switching devices 310 (e.g. transistors), an LC circuit 312, a first transformer 314, a second transformer 316, and a rectification circuit 320.

The controller 308 in some example embodiments is coupled to receive the input voltage 304. The set of switching devices 310 (e.g. switching transistors) are also coupled to receive the input voltage 304. The first transformer 314 includes an input/primary winding coupled to the switching devices 310 via the LC circuit 312. The first transformer 314 also includes an output/secondary winding configured to generate a secondary winding output voltage 322. The rectification circuit 320 receives the secondary winding output voltage 322 and generates the output voltage 306.

The second transformer 316 is not flux coupled to the first transformer 314, but instead has its own input/primary winding coupled to directly receive the secondary winding output voltage 322. The second transformer 316 also includes an output/secondary winding configured to generate an output voltage monitoring signal 318 from the secondary winding output voltage 322.

In some example embodiments, the controller 308 is configured to control the switching devices 310 and thus the output voltage 306, based on the output voltage monitoring signal 318. In various example embodiments, the output voltage monitoring signal 318 is also used as a power supply for the switch mode power supply 302 and/or the controller 308.

The example 300 switch mode power supply 302 thus provides an option of providing an output voltage 306 without a need for an additional controller or switches, either on the primary or secondary side of the first transformer 314.

Note in some example embodiments the switch mode power supply 302 is a resonant power converter.

Figure 4:
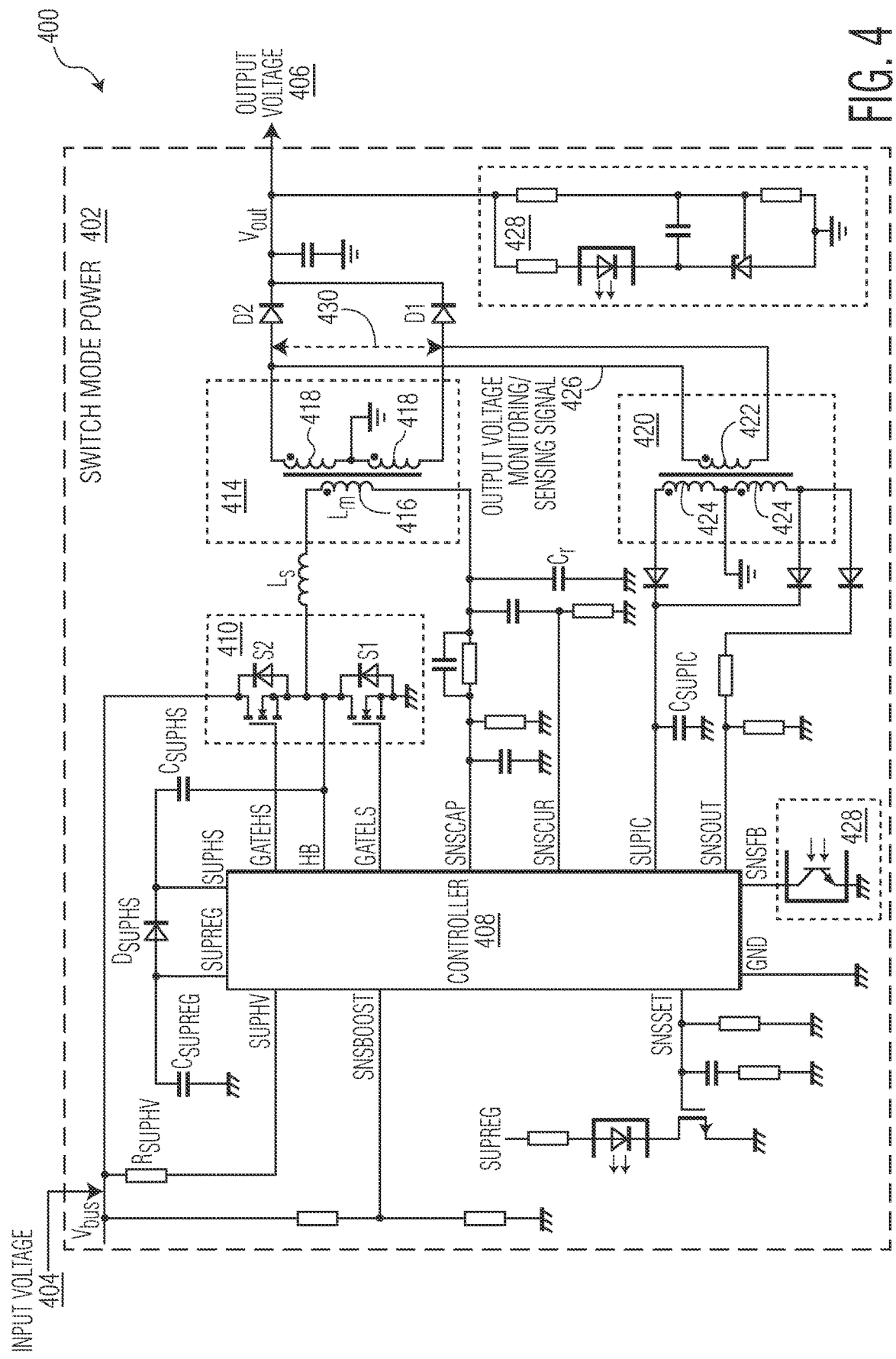
FIG. 4 represents a second example switch mode power supply with two transformers.

FIG. 4 represents a second example 400 switch mode power supply 402 with two transformers. The example 400 switch mode power supply 402 is configured to receive an input voltage (Vbus) 404 and generate an output voltage (Vout) 406. The switch mode power supply 402 includes a controller 408, switching devices 410, an LC circuit (formed by Ls, Lm, Cr as shown in FIG. 4), a first transformer 414, a second transformer 420, and an optical control circuit 428.

The first transformer 414 includes input winding 416 and output winding 418. The second transformer 420 includes an input winding 422, an output winding 424 and is configured to generate an output voltage monitoring/sensing signal 426 from a secondary winding output voltage (Vsec) 430. The optical control circuit 428 provides output voltage (Vout) 406 feedback to the controller 408 for controlling the switching devices 410. The controller 408 can also use the second transformer 420 to directly sense/monitor the secondary winding output voltage 430 for better regulation of the output voltage (Vout) 406.

The switch mode power supply 402 operates in a manner similar to that discussed for the switch mode power supply 302 in FIG. 3. As can be seen, the first transformer 414 and the second transformer 420 are not flux coupled. By keeping the flux of the first transformer 414 and the second transformer 420 separate, the concern that high output currents from the first transformer 414 would affect the output voltage monitoring/sensing signal 426 based on the output voltage (Vout) 406 is no longer a concern.

Using the separate second transformer 420 to generate the output voltage monitoring/sensing signal 426, instead of using a voltage from an auxiliary winding coupled to the first transformer 414 (as discussed in FIGS. 1 and 2) has the advantage that the output voltage monitoring/sensing signal 426 is not distorted by the secondary current from the first transformer 414 since the output voltage monitoring/sensing signal 426 is now based on the secondary voltage (Vsec) rather than the shared flux from the primary winding 416 in the transformer 414. In this way the output voltage monitoring/sensing signal 426 voltage is a reliable reflection of the output voltage (Vout) 406.

Also, because there is a separate second transformer 420, there is a larger design freedom for choosing a turns ratio ($N_{prim}/N_{sec}$) so as to get the desired output voltage monitoring/sensing signal 426 voltage range.

For example, assume the output voltage (Vout) 406 is to be regulated to 12V and the controller's 408 supply voltage (SUPIC) is to be 18V. Assuming a diode (i.e. the diode between the second transformer 420 and the controller 408) forward voltage is 0.6V. This leads to a voltage Vsec=12.6V and the input voltage of second transformer 420 will be 2×12.6V=25.2V. The output voltage monitoring/sensing signal 426 will be 18V+0.6V=18.6V. So for the second transformer 420, a turns ratio of 25.2/18.6 must be realized which can be done by making $N_{prim}$=42 and $N_{sec}$=31.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A switch mode power supply (SMPS) circuit configured to receive an input voltage and generate an output voltage, comprising:
    a set of switching devices configured to receive the input voltage;
    a first transformer, having an input winding coupled to the switching devices, and an output winding configured to generate the output voltage;
    a second transformer, having an input winding coupled to receive the output voltage from the first transformer, and an output winding configured to generate an output voltage monitoring signal; and
    a controller configured to control the switching devices based on the output voltage monitoring signal;
    wherein the input winding of the second transformer is coupled directly to the output winding of the first transformer.

2. The SMPS circuit of claim 1:
wherein the controller is configured to control the switching devices based only on the output voltage monitoring signal.

3. The SMPS circuit of claim 1:
wherein the output voltage monitoring signal is also configured as a power supply for the switch mode power supply.

4. The SMPS circuit of claim 3:
wherein the controller is solely powered by the output voltage monitoring signal.

5. The SMPS circuit of claim 3:
wherein the controller is solely powered by the output voltage monitoring signal after the switch mode power supply circuit reaches a stable operating state.

6. The SMPS circuit of claim 1:
wherein the output voltage monitoring signal is also configured as a power supply for the controller.

7. The SMPS circuit of claim 1:
wherein the input voltage is a rectified supply (Vbus) voltage.

8. The SMPS circuit of claim 1:
wherein the switching devices form a half-bridge.

9. The SMPS circuit of claim 1:
wherein the output winding of the second transformer is coupled directly to the controller.

10. The SMPS circuit of claim 1:
wherein the first transformer is a resonant transformer and the second transformer is an auxiliary transformer.

11. The SMPS circuit of claim 1:
wherein the switch mode power supply (SMPS) circuit is a resonant power converter circuit.

12. The SMPS circuit of claim 1:
wherein in the second transformer, a ratio of a number of wire turns in the input winding to a number of wire turns in the output winding is a non-integer number.

13. The SMPS circuit of claim 1:
wherein the output winding of the second transformer is center tapped to enable full wave rectification.

14. The SMPS circuit of claim 1:
wherein a magnetic flux of the first transformer is isolated from a magnetic flux of the second transformer.

15. The SMPS circuit of claim 1:
wherein the output winding of the first transformer is configured to be coupled to a load drawing a load current; and
wherein the second transformer is configured to draw a current that is in parallel with the load current.

16. The SMPS circuit of claim 1:
wherein the switching devices are switching transistors.

17. The SMPS circuit of claim 1:
wherein the controller is also configured to receive the input voltage as a power supply for the controller.

18. The SMPS circuit of claim 1:
further comprising an LC circuit coupling the switching devices and the first transformer's input winding.

19. A resonant power converter configured to receive an input voltage and generate an output voltage, comprising:
a set of switching devices configured to receive the input voltage;
a first transformer, having an input winding coupled to the switching devices, and an output winding configured to generate the output voltage;
a second transformer, having an input winding coupled to receive the output voltage, and an output winding configured to generate an output voltage monitoring signal; and
a controller configured to control switching of the switching devices based on the output voltage monitoring signal;
wherein the input winding of the second transformer is coupled directly to the output winding of the first transformer.

* * * * *